United States Patent
Vroman et al.

(10) Patent No.: US 7,052,809 B2
(45) Date of Patent: May 30, 2006

(54) MEMBRANE AND RETICLE-PELLICLE APPARATUS WITH PURGED PELLICLE-TO-RETICLE GAP USING SAME

(75) Inventors: Christopher J. Vroman, Shrewsbury, MA (US); Nathan Abbott, Rindge, NH (US)

(73) Assignee: Mykrolis Corporation, Billerica, MA (US)

( * ) Notice: Subject to any disclaimer, the term of this patent is extended or adjusted under 35 U.S.C. 154(b) by 170 days.

(21) Appl. No.: 10/677,706

(22) Filed: Oct. 2, 2003

(65) Prior Publication Data

US 2004/0109153 A1   Jun. 10, 2004

Related U.S. Application Data

(60) Provisional application No. 60/415,688, filed on Oct. 2, 2002, provisional application No. 60/446,693, filed on Feb. 11, 2003.

(51) Int. Cl.
*G03F 1/14* (2006.01)
*G03B 27/62* (2006.01)
*B01D 46/00* (2006.01)
*B01D 39/20* (2006.01)
*C22C 38/08* (2006.01)

(52) U.S. Cl. .............................. 430/5; 355/75; 55/483; 55/522; 55/523; 55/525; 75/245; 75/246

(58) Field of Classification Search ............... 55/385.1, 55/483, 484, 511, 515, 522, 523, 525, 526; 96/416; 75/245, 246; 430/5; 428/13–14; 355/30, 75

See application file for complete search history.

(56) References Cited

U.S. PATENT DOCUMENTS

| | | | | |
|---|---|---|---|---|
| 4,833,051 A | | 5/1989 | Imamura | 430/5 |
| 5,114,447 A | * | 5/1992 | Davis | 55/485 |
| 5,487,771 A | * | 1/1996 | Zeller | 55/523 |
| 5,814,272 A | * | 9/1998 | Zeller et al. | 419/26 |
| 5,814,381 A | * | 9/1998 | Kuo | 428/14 |
| 6,436,586 B1 | | 8/2002 | Matsuoka et al. | 430/5 |
| 6,475,262 B1 | | 11/2002 | Maulik et al. | 75/246 |
| 6,507,390 B1 | * | 1/2003 | Ivaldi | 355/75 |

* cited by examiner

OTHER PUBLICATIONS

International Organization for Standardization (ISO) 4022, Permeable Sintered Metal Materials—Determination of Fluid Permeability, including Annexes A & B, Second Edition, 1987, pp. 1-9.*

*Primary Examiner*—Mark F. Huff
*Assistant Examiner*—John Ruggles
(74) *Attorney, Agent, or Firm*—Timothy J. King; John E. Pillion

(57) ABSTRACT

A gas porous media which comprises a material having a low coefficient of thermal expansion that is capable of retaining 99.99% or more of particles of a size of about 0.003 microns and larger at 0.2 slpm/cm² while demonstrating a permeability of $3.5 \times 10^{-12}$ m² and a porosity of around 62% is disclosed. The porous media can be fabricated into a frame that is capable of retaining 99.9999999% of particles greater than 0.003 μm in diameter at 8.3 sccm/cm² with a permeability of $3.0 \times 10^{-13}$ m² and a porosity of around 53%. The porous medias can be tailored by changing the raw materials and process to yield media with a range of porosities and that exhibit permeability between $1.0E^{-13}$ and $1.0E^{-11}$ m². The porous media are used in frames for supporting a pellicle and a reticle in a parallel relationship to each other. The frames may comprise porous media in its entirety or the porous media can be fabricated and sealed into a solid support frame.

24 Claims, 4 Drawing Sheets

MEMBRANE AND RETICLE-PELLICLE APPARATUS WITH PURGED PELLICLE-TO-RETICLE GAP USING SAME

This application claims the benefit of provisional application 60/415,688 filed Oct. 2, 2002 and provisional application 60/446,693 filed Feb. 11, 2003.

BACKGROUND OF THE INVENTION

This invention relates to porous media, preferably a porous membrane, with a low coefficient of thermal expansion and photolithography devices that use such porous membrane. It further relates to maintaining an oxygen-purged, particle-free optical path between reticle and a pellicle using said membrane.

In the fabrication of integrated circuits, photolithographic and projection printing techniques are used. In photolithography, an image positioned on a reticle or mask is projected onto a wafer such as a silicon wafer having a photosensitive resist thereon. The reticle is used to transfer a desired image onto the silicon wafer. The semiconductor wafer surface is coated with photosensitive resist in a desired pattern so that an image can be etched thereon. A pellicle comprising a transparent material may be used in combination with the reticle to protect the reticle surface from damage. A frame is interposed between the pellicle and the reticle which are bonded to the frame. The pellicle is mounted on the frame opposite a corresponding reticle to form an air gap between the reticle and pellicle.

Some wavelengths of light used in photolithography are sensitive to absorption by atmospheric oxygen. Hence, when such oxygen-sensitive light wavelengths are used in photolithography, they must be transmitted through an oxygen-purged atmosphere. In addition, this atmosphere must be free of particles which distort the transmitted light so that the image is not distorted.

As photolithography tool manufacturers transition to wavelengths at or below 157 nanometers, contamination control becomes more important. Manufacturers are currently optimizing purge-flow systems and material chemistry to prevent lens contamination caused by the condensation of gasses that form as a result of photoresist exposure to laser light. Deposition from photoresist outgassing can change the optical behavior of the lens in the tool. When this happens, an additional layer forms that is not homogenous over the lens surface which causes the focus to change. This lack of focus will detune the lens and the quality of the image. The atmospheric purification provided at 248 and 193 nm by ozone generated from ambient oxygen is expected to lessen significantly at 157 nm because air is not transparent to the vacuum ultraviolet light. At 157 nm the chamber must be purged of oxygen by being displaced with nitrogen. Presently, purging systems such as radial symmetry purge and cross-field purge alone may not meet the stringent needs of 157 nm and it appears that photolithography tools will need to incorporate contamination control (filtration, diffusion, and purification) methods for tool optimization.

PCT/US00/30432 provides a description of an apparatus that uses a purged pellicle to reticle gap in a lithography system, the contents of which are herein incorporated by reference in their entirety.

The prior art further provides fully porous filter frames constructed of stainless steel. For example, the use of 316L stainless in a porous metal frame.

However, the prior art fails to appreciate or disclose the arduous performance specifications that porous membrane must provide in order to be effective in an apparatus that uses a purged pellicle to reticle gap in a lithography system. It further fails to disclose porous membranes that meet such specifications. Such a membrane must have a low coefficient of thermal expansion due to the fluctuations in temperature that occur during the process. Stresses caused by minor differences in thermal expansion can result in warpage of the frame, such warpage resulting in a shifting of the pellicle, which would direct the light in the wrong location, leading to defects.

In addition, the porous membrane must provide sufficient retention while also providing superior permeability. The permeability is crucial as the quicker the apparatus can be purged, the greater the throughput on the tool. Of course, such high throughput is meaningless if particles can enter the apparatus such that wafer defects are created.

When these characteristics are controlled, oxygen in the air gap between the pellicle and the reticle can be replaced with a desired gas such as nitrogen which does not absorb at the wavelength of the light of choice while providing a filtration function which retains particles of undesired size that distort the light image.

The prior art filter frames failed as the glass pellicle and reticles have coefficients of thermal expansion different than the frames, such that the seals could not hold or the reticles and pellicles would warp upon heating. Such prior art frames also failed as the UV radiation destroyed the polymeric filtration material originally considered for use therein.

The prior art provides no porous media that provides all of these characteristics. Indeed, while starting materials with low coefficients of thermal expansion ("CTE"), such as INVAR, have been available for years, such materials are unsuitable to create a porous membrane with the needed CTE, retention rating and permeability.

Accordingly, it would be desirable to provide a porous media and preferably a porous membrane material with a low CTE that also provides superior retention and permeability. It would also be desirable to provide a filter frame with such porous membrane to which is bonded a pellicle and a reticle having a gas gap therebetween which permits ready replacement of oxygen in the gap with a desired gas and which filters the desired gas to remove particles therein. In addition, it would be desirable to provide such a frame that can be machined in a manner to provide flat frame surfaces to support the pellicle and the reticle in parallel relationship with each other.

SUMMARY OF THE INVENTION

The present invention provides a porous media, preferably a membrane, that is fabricated in such a way that it is capable of retaining 99.99% of particles greater than 0.003 microns in diameter at 0.20 slpm/cm$^2$ and having a permeability of $3.5 \times 10^{-12}$ m$^2$ and a porosity of around 62%. The porous media, preferably a membrane, is also fabricated in such a way that the resultant assembly, in this case a frame, is capable of retaining 99.9999999% of particles greater than 0.003 microns in diameter at 8.3 sccm/cm$^2$ with a permeability of $3.0 \times 10^{-13}$ m$^2$ and a porosity of around 53%. Both porous medias can be tailored by changing the raw materials and process to yield a range of porosities and exhibit permeability between $1.0E^{-13}$ and $1.0E^{-11}$ m$^2$.

The present invention provides a porous frame or a solid frame with porous inserts which supports a pellicle and a reticle which is formed from a frame comprising INVAR which is an alloy of 64 wt. % iron and 36 wt. % nickel and a process of making the frame. The frame can be formed by a powder metallurgy sintering process to form a flat porous sheet of the INVAR alloy followed by shaping steps wherein the frame is cut out from the flat porous sheet. Alternatively, the frame can be formed of an INVAR support frame having slots that extend through the frame thickness. The slots then are filled with a gas porous sintered composition.

The sintered frame can be any shape including four sided (square or rectangular). A portion of the frame is gas impermeable while the remainder of the frame is gas permeable. When the frame is four sided, two opposing sides include a gas impermeable surface while the two remaining opposing sides are permeable to a gas and are capable of filtering particles of an undesired large size from a gas passing through the permeable sides. The density, permeability and particle retention characteristics of the frame or the inserts are controlled to provide desired particle filtration function and desired gas permeability characteristics.

DESCRIPTION OF SPECIFIC EMBODIMENTS

Figure 1:
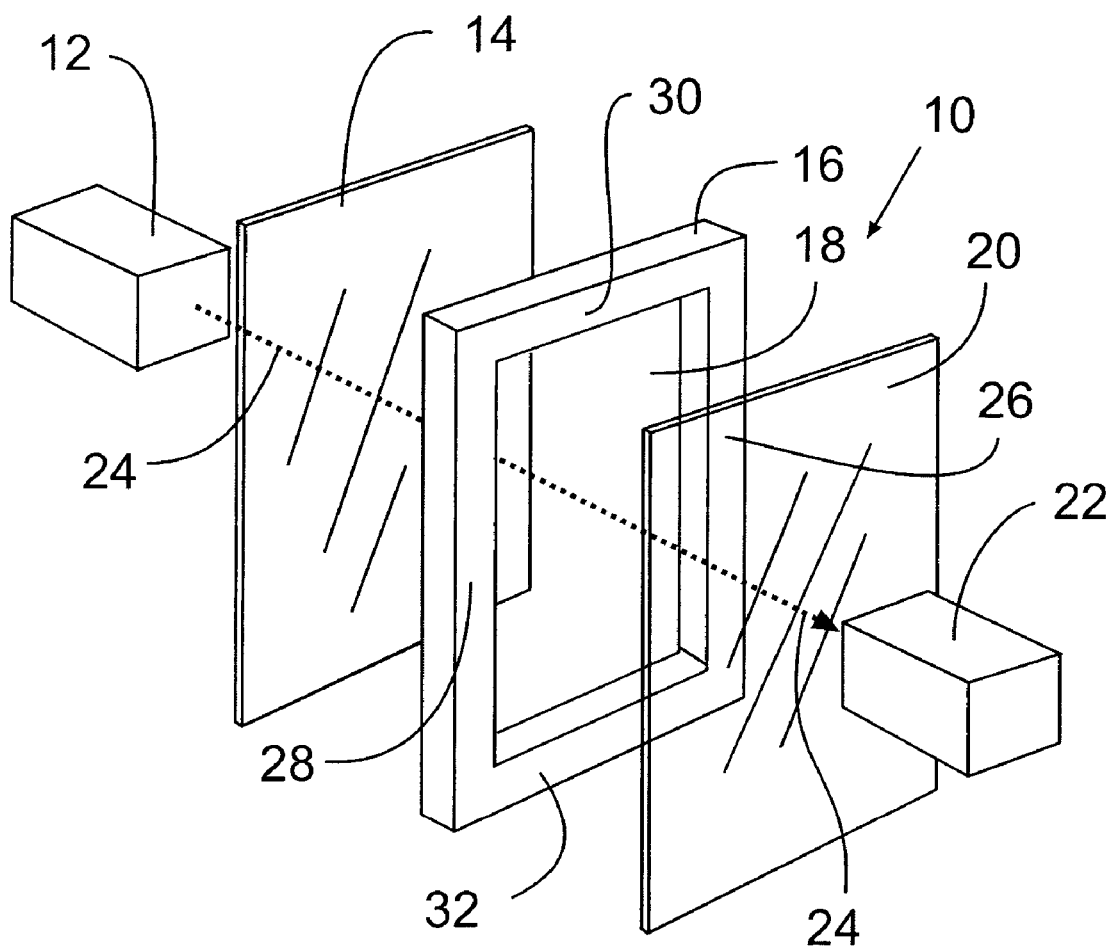
FIG. 1 is a block diagram of an optical path of a lithography process utilizing the frame of this invention.

Fine metal powders are readily available that can be made into porous structures suitable for filtration. These fine powders typically have powder distributions between 2 and 50 microns. These powders can be classified to any size distribution, more preferably high purity filters are made from powders with 90% of the powder is less than 10 microns. These filters have 0.003 um filtration and have a permeability of around $1.0E-13$ m$^2$ for porosities 50–65%. Conversely, filters made from coarser powder distributions often contain more dense structures and worse permeability since green form strength is limited.

For INVAR membrane, many different particle sizes were used to get 0.003 um filtration and permeability in the mid $E-12$ m$^2$ range. Fine particle distributions (90% less than 20 microns) yielded excellent particle capture but permeability's in the $E-13$ m$^2$ range while coarse distributions (50 to 100 um) yielded very fragile green forms and poor particle retention. Therefore, powder distributions were carefully selected to obtain the desired properties.

The porous media and frames of this invention are formed by a powder metallurgy sintering process with a dendritic INVAR alloy metal powder produced by the process disclosed and claimed in U.S. Pat. No. 5,814,272 which is incorporated herein by reference in its entirety. The dendritic metal powder is formed by (1) heating a non-dendritic powder of particles under conditions suitable for the initial stage of sintering to form a lightly sintered material and (2) breaking the lightly sintered material to form a powder comprising dendritic particles. Steps 1 and 2 above are conducted 2 to 3 times. The powder utilized to form the frame of this invention is heated in step (1) to a temperature between about 800° C. and about 1150° C., preferably between about 900° C. and about 1000° C. and can be effected at different temperatures within these ranges under vacuum or in an inert atmosphere such as argon or nitrogen or in a reducing atmosphere such as hydrogen. In the latter two cases, the pressure is preferably between 0 atmospheres and about 1.5 atmospheres. Step (1) is generally conducted between about 0.25 hours and about 1.0 hours, preferably between about 0.25 hours and about 0.75 hours. Step (2) can be conveniently effected by brushing the sintered powder through a screen where the screen mesh size sets an upper limit for particle diameter.

In one embodiment, the frame comprises an INVAR frame having slots which extend through the frame thickness. The slots are filled with a porous sintered filtration composition formed of stainless steel, a nickel, nickel alloy, titanium, titanium alloys, chromium, chromium alloys, metal oxides, ceramics (oxides or non-oxides), INVAR or the like.

In making the frame of this invention, in one embodiment, the above-described dendritic powder is formed into a flat solid sheet by sintering. The powder is placed in a mold having the shape of the solid sheet and heated to effect sintering. The sheet has a thickness between about 0.25 inch and about 0.75 inch, preferably between about 0.4 inch and about 0.5 inch. Sintering is conducted at a temperature between about 1200° C. and about 1400° C., preferably between about 1275° C. and about 1325° C. Sintering is effected in a vacuum, under an inert atmosphere or in a reducing atmosphere as described above.

The sintered flat sheet is removed from the mold and the frame is formed by cutting it out from the flat sheet. The frame is cut out in a manner to effect the formation of two opposing walls of the frame being non-porous to gas while the remaining two opposing walls of the frame are porous to a gas. By forming the frame in this manner, it is possible to sweep the air gap within the frame with a gas which does not absorb 157 nm light such as nitrogen to displace oxygen in the gap. The gas flows directly from one wall to the opposing wall without being detoured through the intervening non-porous wall. Since the entire length of the porous opposing walls is porous, uniform passage of gas is effected across the length of the porous wall. This is preferable to a frame which has spaced apart holes in the walls since such a frame does not assure uniform gas flow along the wall length, or provide any filtration.

A non-porous wall is effected when cutting a frame wall with a laser such as a carbon monoxide laser or preferably with a diamond cutting wheel.

A porous wall is effected when cutting a frame wall with an EDM wire, typically with a multipass method so that fusion of the formed wall is substantially avoided.

In an alternative embodiment, four separate porous walls can be cut from the solid sheets under the conditions set forth above. Two of the walls have a non-porous surface and two of the walls are porous to a gas. The four walls then can be joined so that the non-porous wall opposes each other using solid elbow joints. The walls can be made separately or preferred, cut from a common disc by any method.

Figure 5:
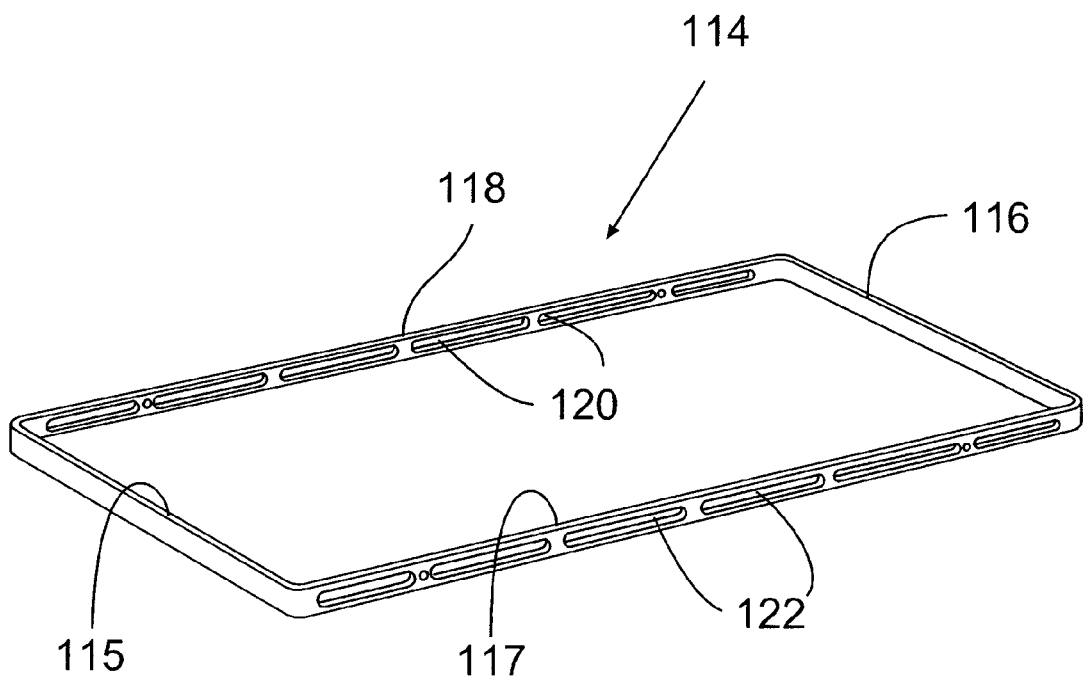
FIG. 5 is a perspective view of a frame support having slots which house a sintered filter composition.

In another alternative of this invention, an INVAR frame support having open slots as shown in FIG. 5 is utilized as a support for a porous sintered filtration composition which is inserted into the slots. The slots are positioned on opposing legs of the frame so that gas can flow through the filtration composition in the slots and thus, through the frame.

The outside surfaces of the frame walls to which are bonded the pellicle and reticle are ground and lapped to be flat about the frame periphery and so that the pellicle and recticle are positioned parallel to each other. Bonding can be effected with an epoxy adhesive, or the like. When so formed, the optical path assembly comprising the pellicle, the reticle and the frame having an air gap containing gas which can be displaced with nitrogen so that it can be utilized in a lithographic process with 157 nm light. Uniformity of inserts and flatness of the frame assembly are key attributes of the frame. The variation in permeability of the inserts can be as narrow as 1%, or as high as 10% depending on the final application, most preferably around 5%. The flatness and parallelism of the frame is most preferably 0.00002 inch.

Referring to FIG. 1, photolithography system 10 comprises an illumination source 12, a pellicle 14, a porous frame 16 having an air gap 18, a reticle 20 and a semiconductor wafer 22. Illumination source 12 includes any applicable source of radiation 24 such as 157 nm light suitable for exposing the surface of semi-conductor wafer 22 surface.

Pellicle 14 is attached to a frame 16 and includes a mask with a pattern that is transferred to a surface of semiconductor wafer 22 by radiation 24 from illumination source 12.

Opposing walls 26 and 28 of frame 16 are porous to gas while opposing walls 30 and 32 are nonporous to gas. Pellicle 14 is in optical alignment with reticle 20.

Radiation 24 is transmitted through pellicle 14, porous frame 16 and reticle 20 to semiconductor wafer 22. Semiconductor wafer 22 includes a surface to be exposed and etched with a pattern of reticle 20 by radiation 24.

Air gap 18 is filled with a purge gas, such as nitrogen, that does not contain oxygen so that no oxygen is contributed from the frame pores or from the air gap 18 thereby to avoid any oxygen-sensitive wavelengths of radiation 24. Porous frame 16 also prevents particulate contamination from entering air gap 18. Walls 26 and 28 of frame 16 have sufficient porosity to allow gas to pass from air gap 18 to the atmosphere. In accordance with this invention, the gas porous portion of the frame has a porosity of between about 40% and about 65% and a density volume about 2.85 g/cc and about 4.85 g/cc.

Figure 2:
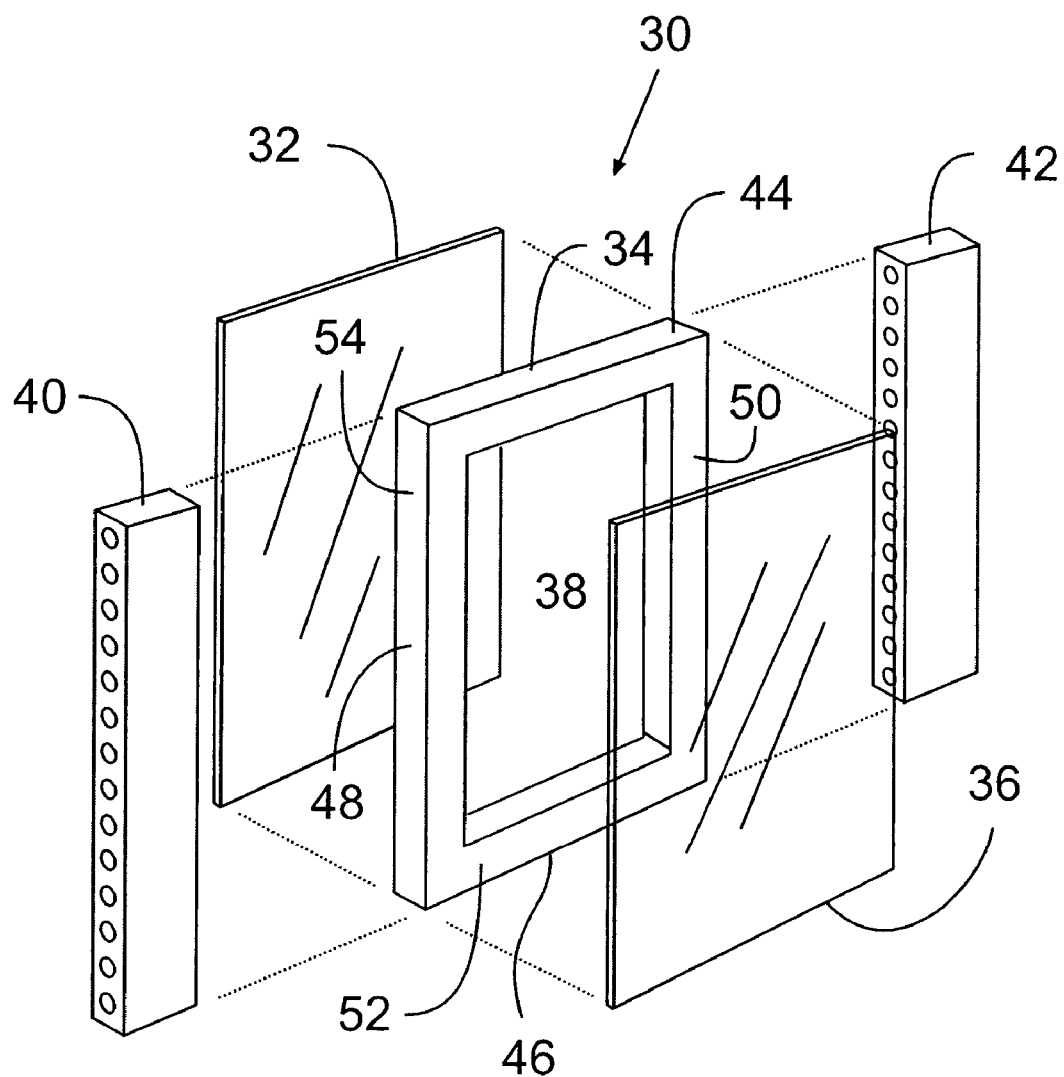
FIG. 2 is an exploded view of a recticle-pellicle apparatus utilizing the frame of this invention.

Referring to FIG. 2, purged pellicle-to-reticle gap system comprises a reticle 32, a porous frame 34, a pellicle 36, an air gap 38, a purge gas supply 40, and a vacuum source 42.

INVAR porous frame 34 comprises a first nonporous surface 44 and a second nonporous surface 46 which are substantially parallel to one another. Porous frame 34 also includes first porous surface 48 and second porous surface 50 which are parallel to each other. The porous filtering material of porous surfaces 48 and 50 allows the transmission of gases, but prevents the transmission of particles. These particles include particle having a size (diameter) greater than about 0.003 microns. In a preferred embodiment, porous frame 34 is substantially rectangular or square. In alternative embodiments, porous frame 34 can be other shapes, such as circular, elliptical or irregular. The membrane of this invention preferably has a log reduction value (LRV) greater than 9, that is removal of particles having a 0.003 micron diameter or larger is 99.9999999% or greater at flows up to 100 standard cubic centimeters per minute (sccm) across the porous surfaces. For this particlular invention, a porous rectangular frame, 100 sccm flow corresponds to a face velocity of 8.3 sccm/cm$^2$. The permeability of this porous frame is typically around $3.0 \times 10^{-13}$ m$^2$.

Pellicle 36 is bonded to surface 52 of frame 34. Pellicle 34 may comprise a glass, a membrane, or other transparent composition to form an air-tight seal surface 52 so that air gap 38 is completely enclosed.

Reticle 32 is bonded to surface 54 of frame 34 such that air gap 38 is completely enclosed to form an air tight seal. Bonding surfaces 52 & 54 are substantially parallel to one another to minimize distortion of the pellicle/frame/reticle assembly.

Vacuum source 42 with a vacuum connects to surface 50 of porous frame 34. As shown in FIG. 2, surface 50 is opposed to surface 48. Vacuum source 42 effects removal of purge gas from air gap 38 through the pores of surface 50.

Purge gas enters the air gap 38 by purge gas supply 40 and is evacuated from the assembly via vacuum source 42 to create a continuous flow of purge gas through air gap 38. The purge gas flow through air gap 38 is balanced to be equal to atmospheric pressure, to eliminate distortion to reticle 32 and/or pellicle 36.

Figure 3:
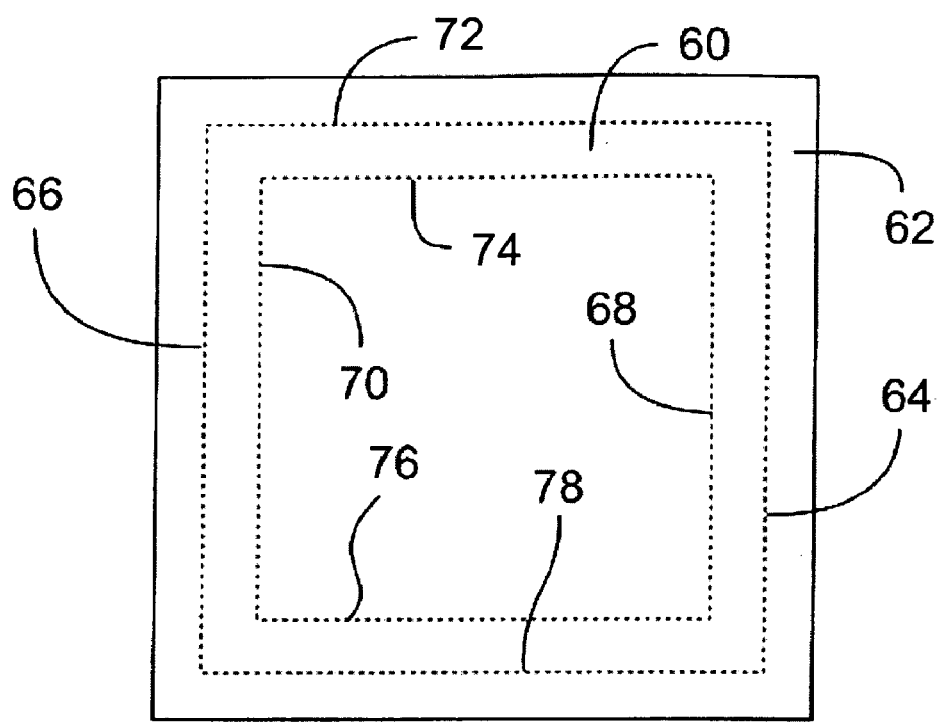
FIG. 3 illustrates one method for making the frame of this invention.

Referring to FIG. 3, the frame 60 in one embodiment of this invention is cut out from flat sheet 62 formed by sintering dendritic INVAR powder. Cutting is effected with a diamond wheel or CO laser along lines 64, 66, 68 and 70 to produce nonporous surfaces. Cutting is effected with EDM under the following conditions to produce gas porous surfaces 72, 74, 76 and 78 which have pores sufficiently small to filter particles having a size of 0.003 microns or larger. Thus, gas flow can be effected from surface 78 through surface 72 or vise versa while gas flow is prevented through surface 66 and 64 thereby permitting gas purging within the air gap formed by cutting surfaces 74, 68, 76 and 70.

Figure 4:
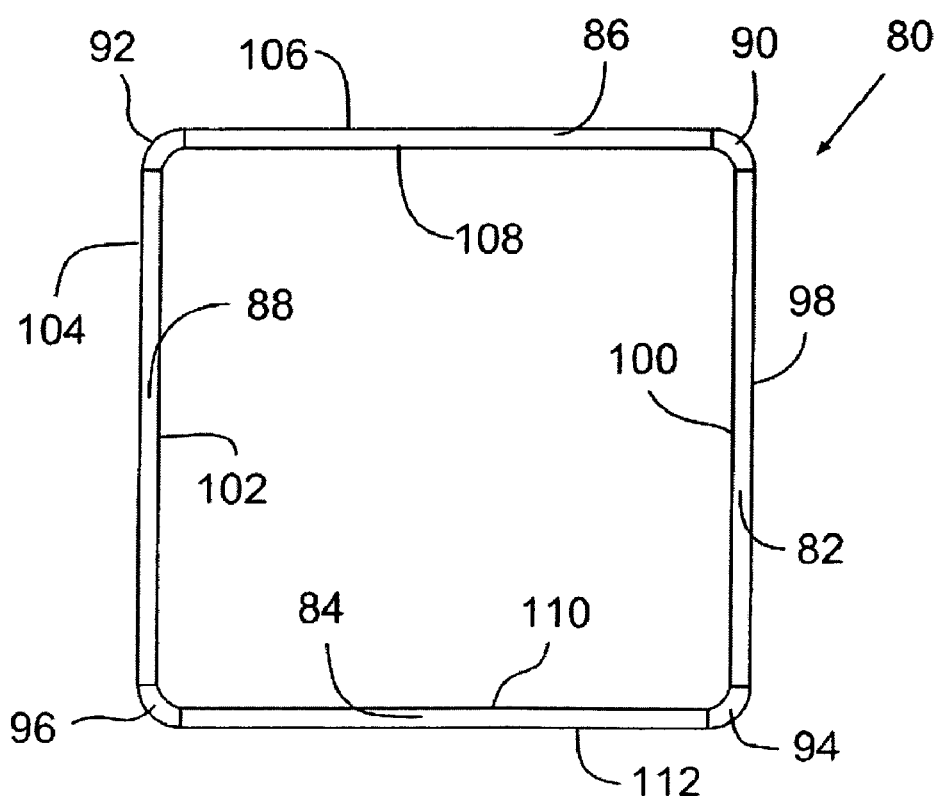
FIG. 4 illustrates an alternative method for making the frame of this invention.

Referring to FIG. 4, the frame 80 is formed from four legs 82, 84, 86 and 88 joined by four elbow joints 90, 92, 94 and 96. The four legs can be cut from a flat sheet in the same manner described above with reference to FIG. 3 so that surfaces 98, 100, 102 and 104 are nonporous to gas while surfaces 106, 108, 110 and 112 are porous to gas so that a frame is formed having the same selective permeability to gas as the frame described above with reference to FIG. 3. The legs and elbow joints form flat surfaces so that a pellicle and reticle can be bonded to the frame 80 in parallel position to each other.

Referring to FIG. 5, the support frame 114 is formed of INVAR and comprises two legs 115 and 116 which are nonporous to gas. Legs 117 and 118 include a row of slots 120 and 122 which extend through the thickness of legs 117 and 118. The rows of slots 120 and 122 are filled with the sintered porous compositions set forth above, preferably porous compositions made of INVAR. The slots 120 and 122 can be formed by machining. The membrane of this invention inserted into the slots are preferrably 57%–63% porous and preferably have a log reduction value (LRV) greater than 4, so that removal of particles having a 0.003 micron diameter or larger is 99.99% or greater at flows up to 0.20 slpm/cm$^2$ across the porous surfaces, and preferably have a permeability of around $3.5 \times 10^{-12}$ m$^2$.

The following examples illustrate the present invention and are not intended to limit the same.

EXAMPLE 1

Material

INVAR (64 wt. % Fe, 36 wt. % Ni) alloy powder was obtained from Ametek Specialty Metals. This powder, as received, had an air-laid density of 3.15 g/cc and had a size distribution such that 90% of the particles fall between 11 and 50 microns. It has a CTE=$1.5 \times 10^{-6}$ in/in/° F.

Method

The powder was treated by the process of U.S. Pat. No. 5,814,272. A 1000 g portion of INVAR powder was placed on a molybdenum plate and lightly pressed with a similar top plate to form a uniform layer of approximately 2.0 cm thickness. The plate holding the powder was placed under vacuum ($10^{-6}$ torr) in a vacuum furnace. The temperature of the furnace was then increased at the rate of 25° C. per minute until the temperature reached 900° C. This temperature was maintained for 30 minutes, then the furnace was allowed to cool to room temperature, thereby obtaining a lightly sintered material. The lightly sintered powder was then placed on a screen with a sieve size of 180 μm and gently broken up into a powder by brushing it through the screen. The resulting powder was again lightly sintered as described above and the resulting material was broken into powder. A total of three initial stage sintering/breaking cycles were performed on this powder sample. The air-laid density of this powder after three treatments was 1.75 g/cc. The distribution ranges from less than 25 μm to greater than 100 μm with the greatest proportion falling between 25 and 100 μm. There is a monotonic decrease in air-laid density with increasing number of treatments. This indicates that the powder particle morphology becomes more irregular with each treatment.

A metal membrane filter element was fabricated from the treated INVAR powder via the following method as described in U.S. Pat. No. 5,847,706. The powder was air-layed into a rectangular mold with dimensions 6.5×5.0× 1.05" then uniaxailly pressed at 40,000 lbs to yield a green form that is 72% porous. The green form is placed in a furnace and sintered at approximately 1300C to yield a final density of 3.8 g/cc. The mother sheet is then ground flat and the outside edges cut via wire EDM. The two short outer sides of the frame are sealed (pores closed) to prevent gas flow therethrough by grinding using a diamond wheel. Before the inside is cut, it is necessary to stress relieve the part through a thermal cycling step. This step occurs in an inert environment or reducing atmosphere at temperatures between 300° C.–400° C. The thermal cycle may be repeated several times to insure the part is stable. The inside of the flat sheet is then cut via wire EDM using a three pass method to complete the frame. A chemical cleaning with HCl acid followed by a deionized water flush was used to clean the part after the final wire EDM process. The cleaning process was followed by a high temperature bake in vacuum or a reducing atmosphere ($H_2$) at a temperature of between 800° C.–900° C. This high temperature bake not only removes organic contaminates that may still be in the matrix, but also serves to anneal the frame prior to the final lapping. The full anneal is again followed by the stress relief cycle(s) outlined above.

A critical requirement of the final frame is flatness and parallelism. This is achieved by lapping the already cut frame. To ensure downstream particle cleanliness and minimal outgassing of the final frame, several cleaning procedures are necessary. These may include, but are not limited to Ultrasonic cleaning in deionized (DI) water, a chemical cleaning at room temperature with HCl, DI water flush, and clean dry air flush. To finally remove residual stresses from the cutting and lapping steps and to ensure that the frame will keep it's desired shape and flatness, an additional vacuum bake in the temperature range of 300° C.–400° C. may also be used to further stabilize the frame if necessary.

To achieve the desired purge times and insure the inside volume of the frame is completely purged of oxygen, the final permeability of the frame is critical. Based on the current process described above, the permeability of the INVAR membrane was found to be $3.0 \times 10^{-13}$ $m^2$ (per ISO 4022). This corresponds to a back pressure of 7.7 inches $H_2O$ at a flow rate of 100 sccm with the two shorter sides sealed and the flow outside in, and the downstream to atmosphere. Depending on the specific application, the permeability may vary between $1.0 \times 10^{-13}$ and $1.0 \times 10^{-11}$ $m^2$. For the example described above, this corresponds to a density of the frame of approx. 2.85–4.85 g/cc.

The particle retention of the final frame is also critical. At the above testing conditions, the filter frame was found to have a greater than 9 LRV, verified at the most penetrating particle size, and for particles down to 0.003 Am at 8.3 sccm/$cm^2$.

EXAMPLE 2

INVAR powder was sourced so that 90% of the particles were smaller than 36 microns. The powder was treated by the process of U.S. Pat. No. 5,814,272, which is incorporated herein by reference to an apparent density of 1.6 g/cc. Treated powder manufactured by the process disclosed in U.S. Pat. No. 5,487,771 which is incorporated herein by reference in its entirety to yield a 57% porous INVAR disc having a thickness of 0.127 cm. The resulting membrane was pressed into the solid frame, having slots shown in FIG. 5 and subjected to air flow. The membrane was found to have a permeability of $1.2^{-12}$ $m^2$. At a face velocity of 0.20 slpm/$cm^2$, the membrane was greater than 99.99% efficient at removing all particles greater than 0.003 microns. This membrane can be manufactured to a permeability between $1.0 \times 10^{-13}$ and $1.0 \times 10^{-11}$ $m^2$, and most preferrably between $5.0^{-12}$ $m^2$ and $5.0^{-13}$ $m^2$. The porosity can range between 40% and 70%, and most preferably between 57% and 66%. Finer powders can also be used, as fine as 90% smaller than 25 microns.

EXAMPLE 3

The solid frame with porous Invar inserts per example 2 was then lapped to a flatness of 0.00003 inch, and the top and bottom sides parallel to 0.00002 inch. During the lapping process, the membrane inserts were isolated from the lapping media, in order to maintain the permeability of the inserts. The membrane was masked by applying a tape over the membrane. After the lapping was completed the tape was removed chemically as not to disrupt the flatness of the solid frame with the porous inserts. As flow uniformity across the insert sides of the frame is a key attribute, the permeability of each insert was measured and the total variation was not greater than 10% and was as good as 1%.

The invention claimed is:

1. A porous media, the bulk matrix of which comprises a material having a low coefficient of thermal expansion; said porous media having been stress relieved to make the porous filter media stable for cutting or lapping, said porous filter media capable of retaining 99.99% or more of particles of a size of about 0.003 microns and larger at 0.2 slpm/$cm^2$; and said porous filter media has a permeability of between $1.0 \times 10^{-11}$ $m^2$ and $1.0 \times 10^{-13}$ $m^2$.

2. The porous filter media of claim 1, wherein the material is a metal.

3. The porous filter media of claim 1, that has a permeability of about $3.5 \times 10^{-12}$ $m^2$.

4. The porous filter media of claim 3, wherein the metal includes a 64 wt. % iron and 36 wt. % nickel alloy.

5. The porous filter media of claim 4, that has a porosity between about 40 and about 65%.

6. The porous filter media in claim 1 made from starting powders where 90% fall between 2 and 36 microns.

7. The porous filter media in claim 6 made from starting powders where 90% fall between 2 and 26 microns.

8. The porous filter media in claim 1 made from starting powders where 99% are less than 50 microns.

9. A porous metal filter frame for supporting a pellicle and a reticle positioned in parallel relationship to each other which comprises:
at least one wall, the ends thereof joined to form an air gap subtended by said at least one joined wall,
two opposing sections on a single wall or walls including the porous media of claim 1.

10. The porous metal filter frame of claim 9, wherein its shape is rectangular.

11. The frame of claim 9, wherein its shape is square.

12. The frame of claim 9, wherein its shape is oval.

13. The frame of claim 9, wherein its shape is circular.

14. An optical apparatus which comprises the frame of claim 9 bonded to a transparent pellicle and a reticle optical mask bonded to said frame in parallel relationship to each other.

15. The frame of claim 9 having at least two walls wherein said walls are joined directly to each other.

16. The frame of claim 9 having at least two walls wherein said walls are joined together by elbow joints.

17. The frame of claim 9 having a porous media with a density between about 2.85 and about 4.85 g/cc and having two opposing gas porous walls capable of retaining 99.9999999% or more particles of about 0.003 microns or larger at 8.3 sccm/cm$^2$.

18. The frame of claim 9 wherein said porous media has a density between about 2.85 and about 4.85 g/cc and said two opposing sections have a permeability between $1.0E^{-13}$ and $1.0E^{-11}$ m$^2$.

19. The frame of claim 9 wherein the porous media is made from starting powders where 99% are less than 50 microns.

20. The frame of claim 9, wherein the frame includes solid and porous media portions.

21. The frame of claim 9 having two opposing walls being nonporous to gas.

22. The frame of claim 21, wherein the solid portion defines apertures for receiving porous media.

23. The frame of claim 22 having two opposing walls having slots which extend through the wall thickness, said slots being filled with the porous media.

24. The frame of claim 9 having a porous media with a porosity between about 40% and about 65%.

* * * * *